United States Patent [19]
Goodwin

[11] 3,803,705
[45] Apr. 16, 1974

[54] METHOD OF FORMING A MNOS MEMORY DEVICE

[75] Inventor: Norman W. Goodwin, Encino, Calif.

[73] Assignee: Litton Systems, Inc., Beverly Hills, Calif.

[22] Filed: May 22, 1972

[21] Appl. No.: 255,279

[52] U.S. Cl. .................. 29/571, 29/578
[51] Int. Cl. .................. B01j 17/00
[58] Field of Search .......... 29/571, 578; 317/235 B

[56] References Cited

UNITED STATES PATENTS 3,707,656 12/1972 Dewitt .................. 317/235 B
3,724,065 4/1973 Carbajal et al. .................. 29/578

*Primary Examiner*—W. C. Tupman
*Attorney, Agent, or Firm*—Donald J. Ellingsberg

[57] ABSTRACT

A MNOS memory device is formed by a process that eliminates or substantially minimizes contamination during formation and that results in a semiconductor device having a high field inversion threshold.

14 Claims, 3 Drawing Figures

METHOD OF FORMING A MNOS MEMORY DEVICE

BACKGROUND OF THE INVENTION

Metal oxide semiconductors (MOS) and metal nitride oxide semiconductors (MNOS) have been described and developed for use in electronic circuits. (See S. R. Hofstein and F. P. Heiman, "The Silicon Insulated-Gate Field-Effect Transistor," Proc. IEEE, Vol. 51, No. 9, p. 1,190, Sept. 1963. See also U. S. Pat. No. 3,636,530, granted January 18, 1972, assigned to the same assignee as the present invention.) However, the development of MOS and MNOS devices is not without its problems.

One common method of producing these devices, and particularly MNOS devices, includes several processing steps which are directed to the growth of selected oxide layers. Because these oxide layers are relatively thick, between 3,000 and 10,000 A., oxidation is completed at relatively high temperatures and for extended time periods. It is, therefore, extremely difficult to prevent these oxide layers from becoming contaminated with mobile impurities. Also, these impurities can diffuse into a gate oxide layer, between 500 to 1,000 A. thick, and lead to ionic drift instability in the device.

U. S. Pat. No. 3,411,199, granted Nov. 19, 1968, is directed to the preparation of a semiconductor device wherein a solution to the problem of contaminated oxide layers is taught. However, the problem of ionic drift instability remains.

OBJECTS OF THE INVENTION

Accordingly, it is an object of the invention to provide a new and improved method of producing an MNOS device.

It is an object of the invention to provide a method of producing an MNOS memory device.

It is an object of the invention to provide a method of producing an MNOS device having a relatively thin memory oxide layer.

It is an object of the invention to provide a method of producing an MNOS device wherein a memory oxide layer and a contiguous nitride layer can be sequentially grown without exposure to an ambient atmosphere.

It is an object of the invention to provide a method of producing an MNOS memory device having a substantially reduced probability of threshold shift due to induced migration of mobile ions.

SUMMARY OF THE INVENTION

Briefly, in accordance with the invention, a method of producing an MNOS memory device is provided including the steps of removing a protective coating from and altered substrate, cleaning the export substrate, sequentially growing a memory layer, an ion-impermeable layer, and a protective layer, and then forming a plurality of selectively positioned electrodes.

While the specification concludes with claims particularly pointing out and distinctly claiming the subject matter which may be regarded as the invention, the organization and method of operation, together with further objects, features, and the attending advantages thereof, may best be understood when the following description is read in connection with the accompanying drawing.

DESCRIPTION OF THE INVENTION

Figure 1:
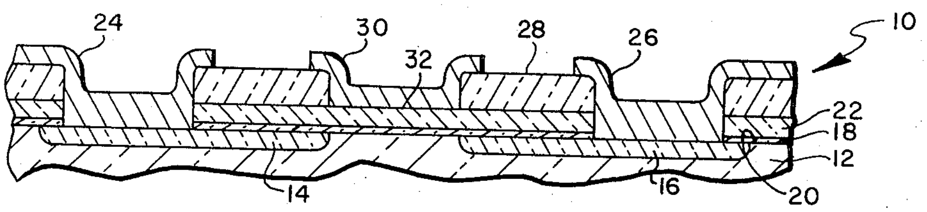
FIG. 1 is a greatly enlarged sectional view of one MNOS memory device formed in accordance with the method of the present invention.

Referring to FIG. 1, one MNOS memory device 10 formed in accordance with the method of the present invention is illustrated. A substrate wafer 12, preferably N-type silicon, has P-type regions 14 and 16 formed into the N-type silicon. A relatively thin silicon dioxide ($SiO_2$) layer 18 is formed over surface 20 of the substrate wafer 12. A silicon-nitride ($Si_3N_4$) layer 22 is formed over the silicon-dioxide layer 18. Openings are provided through the silicon-dioxide layer 18 and silicon-nitride layer 22 for a metal source electrode 24 that is in electrical continuity with source region 14, and for a metal drain electrode 26 that is in electrical continuity with drain region 16. A silicon-dioxide layer 28 covers the silicon nitride layer 22, and has openings for the electrodes 24 and 26. An additional opening is provided in the layer 28 for a metal gate electrode 30 that contacts the surface 32 of the silicon-nitride layer 22.

Figure 2:
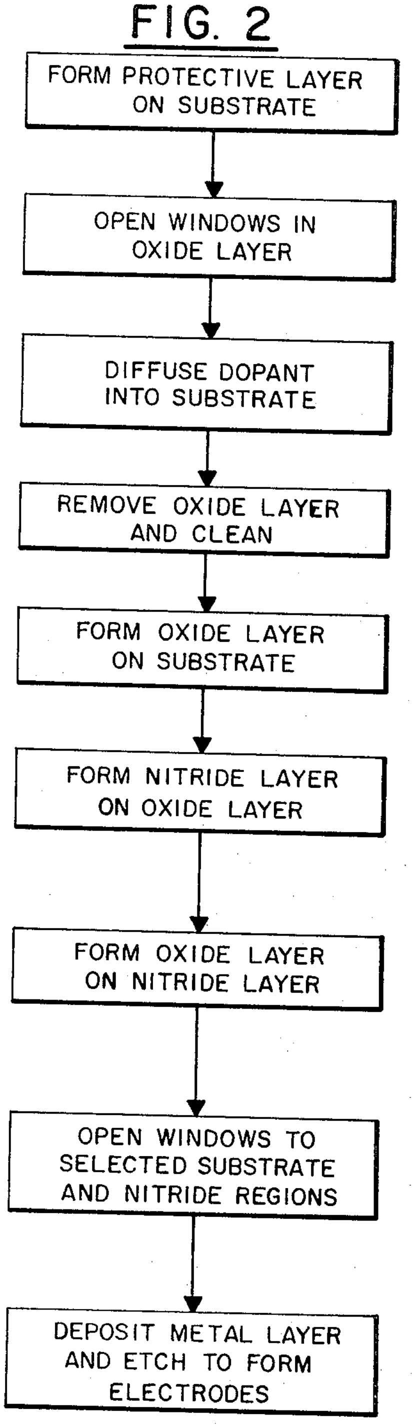
FIG. 2 is a flow chart of the steps in producing the MNOS memory device of FIG. 1.
Figure 3:
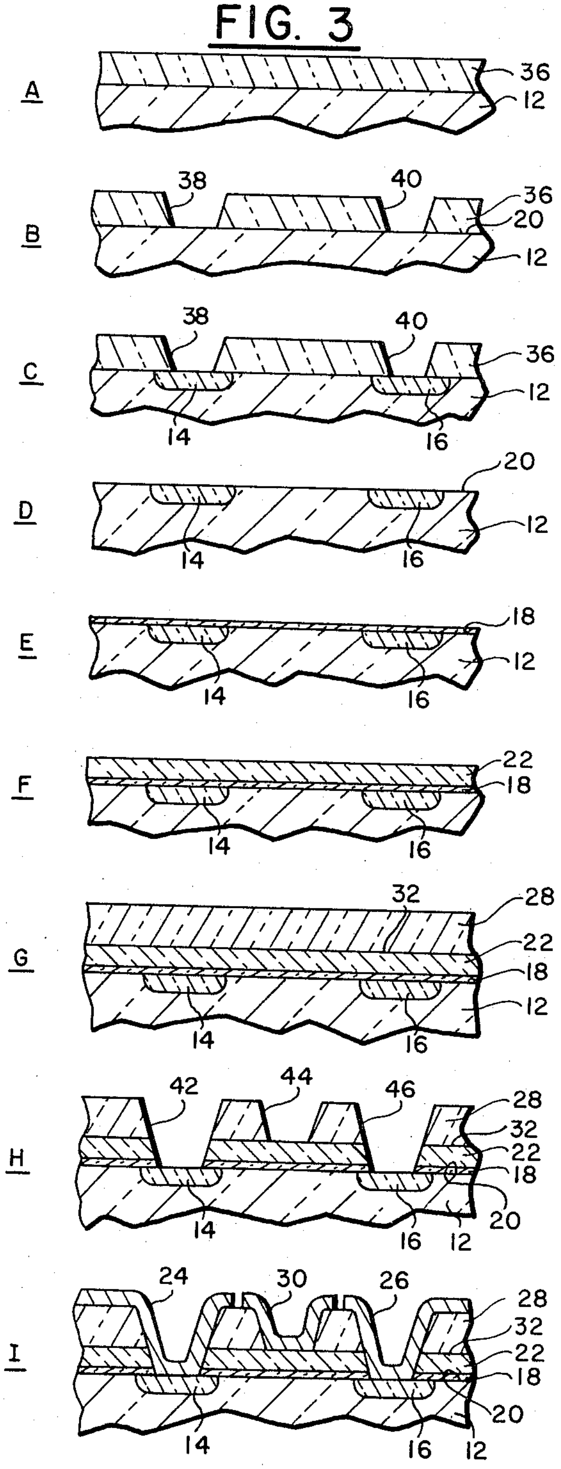
FIG. 3 is a series of greatly enlarged sectional views of the MNOS memory device of FIG. 1 corresponding to the steps in the flow chart of FIG. 2.

In FIG. 2, and the accompanying illustrations in FIG. 3 corresponding to the process of FIG. 2, the MNOS memory device 10 of FIG. 1 is formed by thermal growth of an oxide diffusion mask layer or coating 36 on substrate 12 which may be phosphorous doped silicon that has been suitably prepared by standard procedures for the oxide layer 36. Since this oxide layer is subsequently removed, the exact thickness is not critical; however, it can be between 200 and 10,000 A. Openings or windows 38 and 40 are formed through oxide layer 36 exposing predetermined regions of the surface 20 of the substrate 12. A P-type dopant such as boron is diffused through windows 38 and 40 in a conventional manner, and a P-type source region 14 and a P-type drain region 16 formed in the substrate 12. Then the oxide layer 36 is stripped from the substrate 12 and the then exposed surface 20 cleaned; for example, water wash, alkaline wash, deionized-water wash, and nitrogen dried. The condition of the MNOS memory device 10 at this stage is illustrated by FIG. 3D.

The cleaned substrate 12 is placed on a quartz surface or graphite susceptor in a controlled atmosphere furnace. A silicon dioxide memory layer 18 is then formed on the substrate surface 20 to a thickness between 10 and 100 A. by the oxidation of the substrate surface at a temperature between 800° and 1,000° C. which is determined by the desired thickness of layer 18.

A silicon nitride layer 22 is next formed on the memory layer 18 by the ammonization of silane ($SiH_4$) in a furnace. The furnace used can be the same furnace used in the formation of the layer 18. It is preferred that both the memory layer 18 and the nitride layer 22 are formed sequentially in the same furnace so that the silicon dioxide layer 18 is not exposed to ambient before the formation of the nitride layer 22.

The ammonization of silane can be at the following flow rates: $SiH_4$ between 10 and 100 cubic centimeters per minute (cc/min); $NH_3$ between 1 and 100 liters per minute (l/min); and, $N_2$ between 10 and 100 l/min. For example, a silicon nitride layer has been formed with $SiH_4$ at 10 cc/min, $NH_3$ at 50 l/min. and $N_2$ at 70 l/min. The resulting silicon nitride layer 22 can have a thickness between 200 and 2,000 A. This silicon nitride layer 22 provides an ion impermeable layer on the memory layer 18.

A silicon dioxide layer 28 is then formed on the exposed surface 32 of the silicon nitride layer 22 by the oxidation of silane in a furance. The furnace used can be the same furnace used in the formation of layers 18 and 22; however, the furnace used in the formation of the protective silicon dioxide layer 28 generally will be a separate controlled atmosphere furnace.

The oxidation of silane can be at the following flow rates: $SiH_4$ between 10 and 20 cc/min; $O_2$ between 100 and 1,000 cc/min; and, $N_2$ between 10 and 100 l/min. For example, a silicon dioxide layer has been formed with $SiH_4$ at 16 cc/min, $O_2$ at 180 cc/min, and $N_2$ at 40 l/min. The resulting silicon dioxide layer 28 can have a thickness between 5,000 and 15,000 A. The silicon dioxide layer 28 forms a protective layer and, since the protective layer is relatively thick, provides a high field inversion threshold so that coupling does not occur between source and drain lines where gates lines cross such source and drain lines, particularly in integrated circuits. The MNOS memory device 10 at this stage is illustrated by FIG. 3G.

Source, gate, and drain openings or windows 42, 44 and 46, respectively, are formed in the silicon oxide layer 28 exposing predetermined regions of the surface 32 of the silicon nitride layer 22. Windows 42 and 46 are illustrated by FIG. 3H as respectively adjacent to source region 14 and drain region 16, while window 44 is positioned generally therebetween. The exact size and shape of windows 42, 44, and 46 is not critical, and where the source and drain regions 14 and 16, respectively, have the same size and shape, the source and drain regions may be interchanged without affecting the electrical characteristics of the resulting memory device.

Windows 42 and 46 are additionally formed to open through the silicon nitride layer 22 and the silicon oxide layer 18 and expose the surface 20 of the substrate 12 at the respective source region 14 and drain region 16.

An electrically conductive metal is then deposited in a conventional manner on the exposed surface of the silicon dioxide layer 28 and thus into the windows 42 and 46 to cover the previously exposed surfaces of source and drain regions 14 and 16, respectively, and into the window 44 to cover the previously exposed surface 32 of the silicon nitride layer 22. The metal is then photoetched in a conventional manner leaving a source electrode 24, a drain electrode 26, and a gate electrode 30 as illustrated by FIG. 3I.

As will be evidenced from the foregoing description, certain aspects of the invention are not limited to the particular details of construction as illustrated, and it is contemplated that other modifications and applications will occur to those skilled in the art. It is, therefore, intended that the appended claims shall cover such modifications and applications that do not depart from the true spirit and scope of the invention.

I claim:

1. The method of forming a semiconductor device comprising:

*a.* forming a protective coating on predetermined regions of a substrate surface thereby defining unprotected regions,

*b.* altering the conductivity of the substrate at the unprotected regions,

*c.* removing the protective coating from the substrate surface,

*d.* cleaning the exposed substrate surface,

*e.* growing sequential layers on the clean substrate surface in a controlled environment, the layers including 1. a memory layer having a thickness between 10 and 100 A. on the substrate surface,
2. an ion impermeable layer having a thickness between 200 and 2,000 A. on the memory layer,
3. a protective layer having a thickness between 5,000 and 15,000 A. on the ion impermeable layer, and

*f.* forming a plurality of conductive electrodes including 1. a first electrode on one of the altered substrate regions,
2. a second electrode on another of the altered substrate regions,
3. a third electrode on the impermeable layer generally between and adjacent to said first and second electrodes.

2. The method of claim 1 in which said memory layer is silicon dioxide.

3. The method of claim 2 in which said growing of said memory layer is by the oxidation of a silicon substrate.

4. The method of claim 1 in which said ion-impermeable layer is silicon nitride.

5. The method of claim 4 in which said growing of said ion-impermeable layer is by the ammonization of silane.

6. The method of claim 1 in which said protective layer is silicon dioxide.

7. The method of claim 6 in which said growing of said protective layer is by the oxidation of silane.

8. The method of claim 1 in which said growing of said memory layer and of said ion-impermeable layer is sequentially completed in a controlled atmosphere furnace without exposure to the ambient.

9. The method of claim 1 in which respective ones of said first and second electrodes are source and drain electrodes and said third electrode is a gate electrode.

10. The method of claim 1 in which said protective coating is a temporary oxide layer.

11. The method of claim 1 in which cleaning said exposed substrate surface eliminates contaminants.

12. The method of claim 11 in which said contaminants include oxide.

13. The method of forming a semiconductor device comprising:

*a.* growing a protective oxide layer on a silicon substrate,

*b.* opening windows through said protective oxide layer at predetermined regions to expose the substrate,

*c.* diffusing a suitable dopant through the windows into the exposed substrate to form altered areas in the substrate,

*d.* stripping the protective oxide layer from the silicon substrate,

*e.* cleaning the stripped and exposed substrate surface,

*f.* growing a memory oxide layer having a thickness between 10 and 100 A. on the clean substrate surface,

*g.* depositing an ion-impermeable silicon nitride layer having a thickness between 200 and 2,000 A. on the memory oxide layer,

*h.* depositing a protective silicon dioxide layer having a thickness between 5,000 and 15,000 A. on the silicon nitride layer,

*i.* opening at least a first window in the silicon dioxide layer at a predetermined region to expose the silicon nitride layer,

*j.* depositing a metal layer at said window opening, and

*k.* photoetching the resulting metal layer to form an electrode having a selected characteristic.

14. The method of claim 13 in which the step of opening at least a first window further includes opening a plurality of windows to expose said altered substrate areas, depositing the metal layer at said window openings, and photoetching the metal layer to form a plurality of electrodes having selected electrical characteristics of gate, source, and drain.

* * * * *

PO-1050 (5/69)

UNITED STATES PATENT OFFICE
CERTIFICATE OF CORRECTION

Patent No. 3,803,705 Dated April 16, 1974

Inventor(s) Norman W. Goodwin

It is certified that error appears in the above-identified patent and that said Letters Patent are hereby corrected as shown below:

IN THE SPECIFICATION

Column 1, line 19, BACKGROUND OF THE INVENTION after the word "between delete "3,000 and 10,000 A" and add -- 3,000 Angstroms (A) and 10,000 A --.

IN THE CLAIMS

| | | | |
|---|---|---|---|
| Claim 1, | paragraph e.1., | line 17 and line 18, | after "10" and before "and" add -- A --; |
| | paragraph e.2., | line 20, | after "200" and before "and" add -- A --; |
| | paragraph e.3., | line 22, | after "5,000" and befor "and" add -- A --; |
| Claim 13, | paragraph f., | line 9, | after "10" and before "and" add -- A --; |
| | paragraph g., | line 12, | after "200" and before "and" add -- A --; |
| | paragraph h., | line 2, | after "5,000" and befo: "and" add -- A --. |

Signed and sealed this 1st day of October 1974.

(SEAL)
Attest:

McCOY M. GIBSON JR.
Attesting Officer

C. MARSHALL DANN
Commissioner of Patents